(12) United States Patent
Kato et al.

(10) Patent No.: US 7,659,553 B2
(45) Date of Patent: Feb. 9, 2010

(54) LIGHT-EMITTING SEMICONDUCTOR DEVICE PROTECTED AGAINST REFLECTOR METAL MIGRATION

(75) Inventors: Takashi Kato, Niiza (JP); Junji Sato, Niiza (JP); Tetsuji Matsuo, Niiza (JP)

(73) Assignee: Sanken Electric Co., Ltd. (JP)

( * ) Notice: Subject to any disclaimer, the term of this patent is extended or adjusted under 35 U.S.C. 154(b) by 415 days.

(21) Appl. No.: 11/764,543

(22) Filed: Jun. 18, 2007

(65) Prior Publication Data
US 2007/0290215 A1    Dec. 20, 2007

(30) Foreign Application Priority Data
Jun. 19, 2006    (JP)    ............... 2006-168572

(51) Int. Cl.
*H01L 33/00*    (2006.01)
(52) U.S. Cl. ............... 257/98; 257/79; 257/431; 257/E51.022; 257/E25.032
(58) Field of Classification Search ............... 257/79, 257/98, 431, E51.022, E25.032
See application file for complete search history.

(56) References Cited

U.S. PATENT DOCUMENTS

| | | | |
|---|---|---|---|
| 6,555,405 B2 * | 4/2003 | Chen et al. ............... 438/22 |
| 2001/0042866 A1 * | 11/2001 | Coman et al. ............... 257/103 |
| 2004/0033638 A1 * | 2/2004 | Bader et al. ............... 438/46 |
| 2005/0161682 A1 * | 7/2005 | Mazzochette et al. ......... 257/79 |
| 2006/0231852 A1 * | 10/2006 | Kususe et al. ............... 257/99 |
| 2006/0284195 A1 * | 12/2006 | Nagai ............... 257/98 |

FOREIGN PATENT DOCUMENTS

JP    2002-217450 A    8/2002

* cited by examiner

*Primary Examiner*—Michelle Estrada
(74) *Attorney, Agent, or Firm*—Woodcock Washburn LLP

(57) ABSTRACT

An LED has a light-generating semiconductor region formed on a baseplate via a metal-made reflector layer. The light-generating semiconductor region has an active layer sandwiched between a pair of claddings of opposite conductivity types. An annular marginal space is left around the reflector layer between the light-generating semiconductor region and the substrate. In order to preclude the thermal migration of the reflector metal onto the side surfaces of the light-generating semiconductor region, with a possible short-circuiting of the pair of claddings across the active layer, an anti-migration seal is received in the annular marginal space created around the reflector layer between the light-generating semiconductor region and the baseplate.

11 Claims, 4 Drawing Sheets

LIGHT-EMITTING SEMICONDUCTOR DEVICE PROTECTED AGAINST REFLECTOR METAL MIGRATION

CROSS REFERENCE TO RELATED APPLICATIONS

This application claims priority to Japanese Patent Application No. 2006-168572, filed Jun. 19, 2006.

BACKGROUND OF THE INVENTION

This invention relates to light-emitting semiconductor devices, or light-emitting diodes (LEDs) according to common parlance, and particularly to those having provisions for preventing metal migration from the reflector layer incorporated in the LEDs. The invention also concerns a method of making such migration-proof LEDs.

LEDs in general have a semiconductor region composed and configured to generate narrow-spectrum light of a desired wavelength. Typically, the light-generating semiconductor region has an active layer sandwiched between a pair of confining layers or claddings of opposite conductivity types. Light is generated in the active layer when the device is electrically biased forwardly of the pn junction. Part of the light more or less directly traverses one of the claddings and issues from the light-emitting surface of the light-generating semiconductor region. The rest of the light is radiated toward the substrate via the other cladding. How to redirect the highest possible proportion of this light component back toward the light-emitting surface is one of the key factors that determine the efficiency of the LED.

It is itself not new in the art to provide a layer of reflective metal (hereinafter referred to as the reflector layer) between the light-generating semiconductor region and the substrate, as disclosed for example in Japanese Unexamined Patent Publication No. 2002-217450. The reflector layer suggested in this prior application is made from aluminum and interposed between the light-generating semiconductor region of Groups III-V compound semiconductors and the substrate of silicon. Other reflective materials are adoptable, though, such as silver or silver-base alloy.

The LEDs with such metal-made reflector layers, as so far constructed, possessed a shortcoming: The metal making up the reflector layer was easy of thermal migration onto the other parts of the LED either during or after the manufacture of the device. The migration was most easy to occur during LED manufacture when the light-generating semiconductor region with the reflector layer thereon, after having been grown on a substrate, was being united with a baseplate via a bonding metal layer or layers under heat and pressure. In use of the completed LED, too, the reflector metal would migrate as the device heated up by continued energization.

The likelihood of such reflector metal migration in use is more or less reducible by a protective film enveloping the sides of the LED at which are exposed the side edges of the reflector layer. However, should the protective envelope be not held fast enough against the side edges of the reflector layer by any chance, the reflector metal was easy to migrate onto the side surfaces of the light-generating semiconductor region, possibly short-circuiting the pair of claddings of opposite conductivity types across the active layer. The result was a significant drop in output light intensity.

SUMMARY OF THE INVENTION

The present invention has it as an object to enhance the reliability, and extend the durability, of LEDs of the kind defined by more positively precluding the migration of the metal from the reflector layer than heretofore.

Another object of the invention is to accomplish the first recited object in a way that permits easy manufacture of the migration-proof LEDs.

Briefly, the present invention may be summarized as a light-emitting semiconductor device protected against reflector metal migration in the face of the heat to which the device is unavoidably subjected both during its manufacture and in use. Included is a light-generating semiconductor region having a plurality of semiconductor layers for generating light. A baseplate is held against one of the pair of opposite major surfaces of the light-generating semiconductor region, and an electrode is formed on the other major surface. Interposed between the baseplate and the light-generating semiconductor region is a metal-made reflector layer for redirecting the light from the light-generating semiconductor region back toward said other major surface of the light-generating semiconductor region. The reflector layer is so sized and arranged relative to the light-generating semiconductor region and the baseplate as to leave a substantially annular marginal space between these two parts. Received at least in part in this annular marginal space is an anti-migration seal for sealing the reflector layer against thermal metal migration therefrom. The anti-migration seal is made from a metal that is less easy of thermal migration than the metal from which is made the reflector layer.

The anti-migration seal according to the invention is embedded, so to say, in the space around the reflector layer against the possibility of accidentally coming off. The embedded anti-migration seal is capable of blocking the reflector layer against metal migration far more positively than the known protective envelope which has been merely held against the side of the device.

In a preferred embodiment, the light-generating semiconductor region is united with the baseplate after having been grown in a vapor phase on a substrate. Employed for such union are two bonding metal layers, one formed, as by sputtering, on the light-generating semiconductor region and the other on the baseplate. The anti-migration seal can be made from the same metal (e.g. gold) as at least the bonding metal layer on the light-generating semiconductor region. The anti-migration seal is therefore capable of joint fabrication with the bonding metal layer in one manufacturing step. Made from gold or like reflective metal, moreover, the anti-migration seal serves the additional purpose of reflecting the light from the light-generating semiconductor region in cooperation with the reflector layer.

Another aspect of the invention concerns a method of fabricating the migration-proof light-emitting semiconductor device of the above summarized construction. The constituent layers of the light-generating semiconductor region are first grown successively in vapor phase on a substrate. The thus formed light-generating semiconductor region has a first major surface held against the substrate and a second major surface facing away therefrom. Then a metal-made reflector layer is formed on the second major surface of the light-generating semiconductor region so as to leave exposed a substantially annular marginal part of the second major surface. Then an anti-migration seal is formed on the annular marginal part of the second major surface of the light-generating semiconductor region. Then a baseplate is bonded to the second major surface of the light-generating semiconductor region via the reflector layer and the anti-migration seal. The substrate, which becomes unnecessary upon completion of the light-generating semiconductor region thereon, is removed from the light-generating semiconductor region either before or after the bonding of the baseplate. Then an electrode is created on the thus exposed first major surface of the light-generating semiconductor region.

Preferably, for bonding the baseplate to the light-generating semiconductor region, a bonding metal layer is sputtered or otherwise formed on the light-generating semiconductor region via the reflector layer and anti-migration layer. Then the light-generating semiconductor region and the baseplate are united via the bonding metal layer under heat and pressure. The anti-migration seal and the bonding metal layer can be formed continuously or substantially concurrently in one piece with each other from the same material.

The above and other objects, features and advantages of this invention will become more apparent, and the invention itself will best be understood, from a study of the following description and appended claims, with reference had to the attached drawings showing some preferable embodiments of the invention.

DETAILED DESCRIPTION OF THE INVENTION

Figure 1:
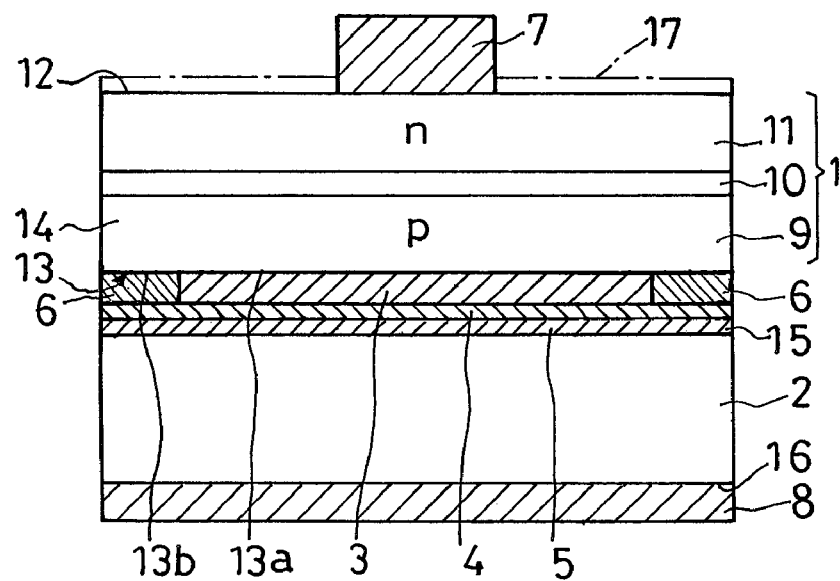
FIG. 1 is a sectional illustration of the migration-proof LED built on the novel concepts of this invention.

The present invention is believed to be best embodied in the migration-proof double-heterojunction LED shown completed in FIG. 1 and in successive steps of fabrication in FIGS. 2-6. With particular reference to FIG. 1 the representative LED broadly comprises:

1. A light-generating semiconductor region 1 where light is produced and which is herein shown as a lamination of three constituent layers of double heterojunction configuration to be detailed shortly.

2. A baseplate 2 of electrically conducting material providing both mechanical support and current path for the LED.

3. A metal-made reflector layer 3 interposed between the light-generating semiconductor region 1 and the baseplate 2 so as to leave an annular marginal space around itself and between the semiconductor region 1 and the baseplate 2.

4. Two bonding metal layers 4 and 5, one formed as by sputtering on the light-generating semiconductor region 1 via the reflector layer 3 and the other on the baseplate 2, which have been joined together under heat and pressure for uniting the light-generating semiconductor region and the baseplate via the reflector layer.

5. An annular anti-migration seal 6, which constitutes a feature of this invention, filling the noted annular marginal space left by the reflector layer 3 around the same between light-generating semiconductor region 1 and baseplate 2.

6. A first electrode or cathode 7 on one, 12, of the pair of opposite major surfaces of the light-generating semiconductor region 1, the other major surface 13 thereof being held against the reflector layer 3.

7. A second electrode or anode 8 on the underside of the baseplate 2.

In order to provide the double heterojunction LED as one possible application of the invention, the light-generating semiconductor region 1 is shown comprising a lower confining layer or cladding 9 of a p-type semiconductor, an active layer 10, and an upper confining layer or cladding 11 of an n-type semiconductor. The constituent layers 9-11 of the light-generating semiconductor region 1 are all made from Groups III-V compound semiconductors, preferably nitride semiconductors. The chemical compositions of these layers 9-11 will be detailed in the following paragraph. Despite the showing of FIG. 1 and other drawings, the active layer 10 may be omitted, and the two opposite conductivity layers 9 and 11 placed contiguous to each other, in cases where the double heterojunction construction is not required.

The preferred semiconducting nitrides from which can be made the constituent layers 9-11 of the light-generating semiconductor region 1 are generally defined as:

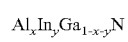

where the subscripts x and y are both numerals that are equal to or greater than zero and less than one. Thus the formula encompasses not only aluminum indium gallium nitride but also indium gallium nitride (x=0), aluminum gallium nitride (y=0), and gallium nitride (x=0, y=0). The p-type cladding 9 is made from GaN plus a p-type dopant, the active layer 10 from undoped InGaN, and the n-type cladding 11 from GaN plus an n-type dopant, in this particular embodiment.

It is understood that, although not clearly indicated in FIG. 1, the active layer 10 has a plurality of sublayers of familiar multiple quantum well design. The active layer 10 might not be divided into such sublayers, though. Also, instead of being left undoped as in this embodiment, the active layer 10 might be doped with an either p- or n-type impurity.

The light-generating semiconductor region 1 as a whole is generally boxlike in shape, rather thin, having the aforesaid pair of opposite major surfaces 12 and 13 and a set of four side surfaces 14 therebetween. Facing away from the baseplate 2, the first major surface 12 is the light-emitting surface of the LED from which is produced the light that has been generated in the active layer 10. The light is radiated not only toward the first major surface 12 but toward the second major surface 13 of the light-generating semiconductor region 1 which is held against the baseplate 2 via the reflector layer 3. This reflector layer redirects the incident light back toward the first major surface 12 for emission therefrom together with the light component that has been radiated more or less directly toward that surface.

The baseplate 2 serves as a mechanical support for the light-generating semiconductor region 1, not as a substrate for growing this region thereon. A substrate is needed and actually used as in FIG. 2 for growing the light-generating semiconductor region 1 but removed at some time after its growth. It is difficult to grow a light-generating semiconductor region of required flatness and crystallinity to a sufficient thickness to be self-supporting. The light-generating semiconductor region 1 is in fact so thin, so susceptible to destruction, that it must be mechanically supported by bonding the baseplate 2 of sufficient mechanical strength via the reflector layer 3, as will be better understood from the subsequent description of the method of making this LED.

The baseplate 2 is made in sheet form to possess a pair of opposite major surfaces 15 and 16. The first or upper major surface 15 of the baseplate 2 is bonded to the light-generating semiconductor region 1 via the reflector layer 3, and the anode 8 is formed on the second or lower major surface 16. The baseplate 2 should be sufficiently thick (e.g., 200-1000 micrometers) to serve as a mechanical support for the light-generating semiconductor region 1, reflector layer 3, and electrodes 7 and 8. Further, being intended for use as part of the current path between the electrodes 7 and 8, the baseplate 2 is made from silicon that has been doped with an n-type impurity to a concentration ranging from $5 \times 10^{18}$ cm$^{-3}$ to $5 \times 10^{19}$ cm$^{-3}$. The resistivity of the resulting baseplate 2 is in the range of 0.0001-0.0100 ohm-cm. Alternatively, the baseplate 2 could be made from p-doped silicon, other semiconductors doped into sufficient conductivity, or metals.

The reflector layer 3 is formed on a predefined midportion $13_a$ of the second major surface 13 of the light-generating semiconductor region 1, leaving an annular marginal portion $13_b$. The reflector layer 3 is made from metal, preferably silver, silver-base alloy, or aluminum, for reflecting the maximum possible proportion of the light coming from the light-generating semiconductor region 1. The thickness of the reflector layer 3 may be in the range of 50-1500 nanometers.

Filling the annular marginal space left by the reflector layer 3 between light-generating semiconductor region 1 and baseplate 2, the anti-migration seal 6 is made from gold to the same thickness as the reflector layer 3. The width $W_2$, FIG. 3, of the annular marginal portion $13_b$ of the second major surface 13 of the light-generating semiconductor region 1, and therefore the width of the anti-migration seal 6, should be in the range of about 1-20 percent of the sum ($W_1 + 2 W_2$) of the dimension $W_1$ of the midportion $13_a$, as measured in the same direction as is the width $W_2$, and twice the width $W_2$ of the annular marginal portion. Should the width $W_2$ be less than the lower limit of this desired range, the anti-migration seal 6 might fail to block metal migration from the reflector layer 3. If wider than the upper limit of the desired range, on the other hand, then the anti-migration seal 6 might inconveniently reduce the efficiency of the LED, the reflector layer 3 having then to be made correspondingly less in size.

It is recommended that the anti-migration seal 6 be formed all around the reflector layer 3. Such an annular anti-migration seal 6 is not, however, an absolute requirement of the invention. Metal migration from the reflector layer 3 will lessen appreciably if the anti-migration seal does not thoroughly encircle the reflector layer 3.

The anti-migration seal 6 must be made from a material that is not only capable of preventing metal migration from the reflector layer 3 but is itself less easy to migrate than the reflector metal. In this particular embodiment the reflector layer 3 is made from silver-base alloy, and the anti-migration seal 6 from gold.

It may be pointed out in connection with the gold-made anti-migration seal 6 that the first bonding metal layer 4 contiguous to both reflector layer 3 and anti-migration seal 6 is also made from gold in this embodiment. Made from the same material, the first bonding metal layer 4 and anti-migration seal 6 are capable of fabrication in one step in the course of manufacture of this LED, as will be detailed presently. Although the first bonding metal layer 4 and anti-migration layer 6 are shown clearly marked off from each other in FIG. 1 as well as in some other drawings to be referred to subsequently, no such demarcation is actually possible if they are of the same material as in this embodiment. The instant invention may indeed be interpreted differently, that the reflector layer 3 is surrounded by part of the first bonding metal layer 4. The first bonding metal layer 4 and anti-migration layer 6 are nevertheless shown as separate parts because they need not be of the same material in a broader aspect of the invention but of different materials capable of performing the respective purposes for which they are intended.

The first bonding metal layer 4 is wholly held against both reflector layer 3 and anti-migration seal 6 and coupled thereto both mechanically and electrically. Although the first bonding metal layer 4 should preferably be made from the same material as the anti-migration seal 6 as aforesaid, it may be made from other materials that are not only fusible and electrically conducting but appropriately less easy to migrate than the reflector metal. The thickness of the first bonding metal layer 4 may be 50-1000 nanometers.

Formed on the first major surface 15 of the baseplate 2 to a thickness of 50-1000 nanometers, the second bonding metal layer 5 is united with the first bonding metal layer 4 under heat and pressure. for bonding the baseplate to the light-generating semiconductor region 1 via the reflector layer 3 and anti-migration seal 6. The second bonding metal layer 5 should also be made from materials that are fusible, electrically conducting, and less easy to migrate than the reflector metal. The second bonding metal layer 5 is also required to be capable of firm union with both baseplate 2 and first bonding metal layer 4. Gold is of course adoptable for the second bonding metal layer 5 too. However, from functional and economic considerations, the second bonding metal layer 5 may take the form of a lamination of a titanium, a nickel and a gold sublayer, with the gold sublayer at the top for direct merging with the gold-made first bonding metal layer 4.

Here again, the first and the second bonding metal layer 4 and 5 are not clearly distinguishable from each other once they have joined with each other under heat and pressure. Thus, despite the showing of FIG. 1, the light-generating semiconductor region 1 together with the reflector layer 3 may be considered to be joined to the baseplate 2 via a single bonding metal layer.

The first electrode or cathode 7 is placed centrally on the light-emitting surface 12 of the light-generating semiconductor region 1. Optionally, as indicated by the broken line in FIG. 1, the cathode 7 may be formed on a current-spreading film 17 covering the entire light-emitting surface 12 in order to assure a more uniform current flow throughout the light-generating semiconductor region 1. The current-spreading film 17 should be either transparent to the light generated in the light-generating semiconductor region 1 or have a multiplicity of perforations or interstices for the passage of the light.

The second electrode or anode 8 is formed on the second major surface 16 of the baseplate 2. Alternatively, the baseplate 2 may be made larger in size than the light-generating semiconductor region 1 so as to provide annular shoulders or ledges protruding from under the light-generating semiconductor region, and the second electrode 8 may be placed on these shoulders or ledges. This second electrode is unnecessary in cases where the baseplate 2 is metal made.

Method of Fabrication

The following is a currently preferred method of making the LED of the construction hereinbefore described with reference to FIG. 1. The fabrication of the LED starts with the preparation of a substrate seen at 20 in FIG. 2. Unlike the baseplate 2, FIG. 1, the substrate 20 is intended for vapor-phase growth of the light-generating semiconductor region 1 thereon, so that it must be of a material that meets this objective. Examples of such a material include gallium arsenide or like Groups III-V semiconductors, silicon, and sapphire. Silicon in particular is recommended for its low cost.

Figure 2:
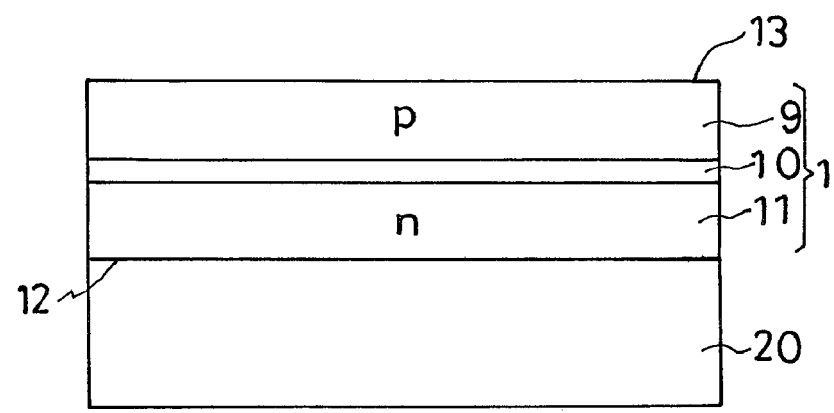
FIG. 2 is a section through the light-generating semiconductor region of the LED, shown together with the substrate on which it has been grown, by way of a first step of making the migration-proof LED of FIG. 1 by the method of this invention.

Then, as depicted also in FIG. 2, the light-generating semiconductor region 1 may be created on the baseplate 20 by successively growing in vapor phase thereon the n-type cladding 11, active layer 10, and p-type cladding 9, in that order, that is, in the reversal of the order in which these layers are placed one on top of another in FIG. 1. Thus the completed light-generating semiconductor region 1 has its first major surface 12 held against the baseplate 20 and its second major surface 13 facing away therefrom. As required, the light-generating semiconductor region 1 may be grown on the baseplate 20 via a buffer layer which is not shown because of its conventional nature.

Figure 3:
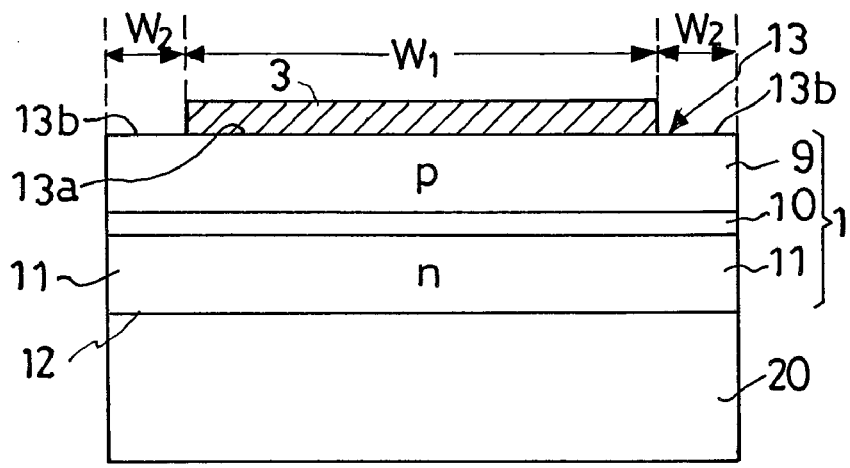
FIG. 3 is a view similar to FIG. 2 except that the metal-made reflector layer is shown formed on one of the opposite major surfaces of the light-generating semiconductor region, leaving exposed an annular marginal portion of that surface.

The next step is the fabrication of the reflector layer 3 on the midportion $13_a$ of the exposed second major surface 13 of the light-generating semiconductor region 1 as in FIG. 3. The reflector layer 3 may be formed by first sputtering silver onto the complete second major surface 13 of the light-generating semiconductor region 1 and then by selectively etching the silver layer so as to expose the annular marginal portion $13_b$ of the second major surface of the light-generating semiconductor region.

Figure 4:
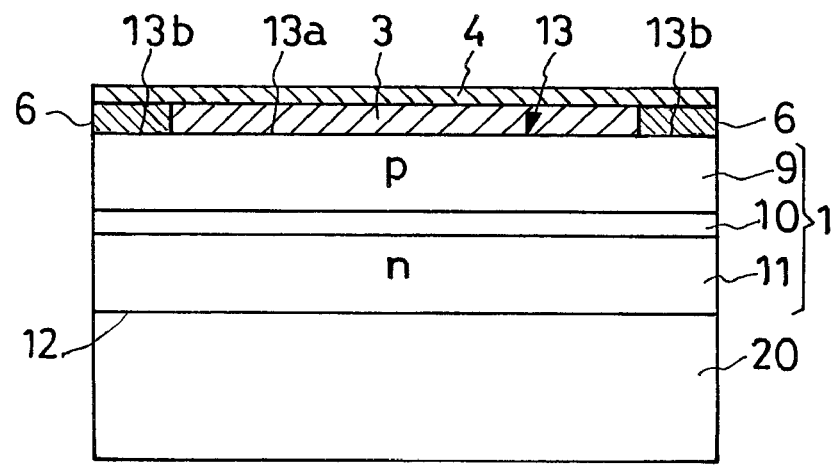
FIG. 4 is a view similar to FIG. 2 except that the anti-migration seal is shown formed on the annular marginal portion of the light-generating semiconductor region surface which has been left exposed by the reflector layer, and that one bonding metal layer is shown formed on the reflector layer and the anti-migration seal.

Then comes the step of FIG. 4 in which there are shown both the first bonding metal layer 4 and the anti-migration seal 6. The anti-migration seal 6 is formed on the above exposed annular marginal portion $13_b$ of the second major surface 13 of the light-generating semiconductor region 1 by gold sputtering. The first bonding metal layer 4 is shown formed on both reflector layer 3 and anti-migration seal 6 by gold sputtering. Being both made from the same material by the same method, the anti-migration seal 6 and first bonding metal layer 4 are capable of continuous, or practically concurrent, creation in one manufacturing step.

Figure 5:
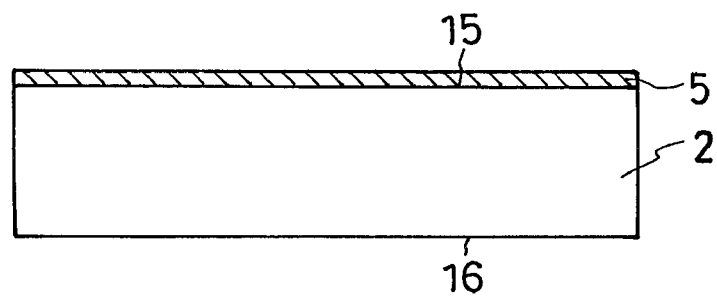
FIG. 5 is a sectional illustration showing the baseplate with another bonding metal layer formed thereon.

In FIG. 5 is seen the baseplate 2 which has been prepared aside from the article of FIG. 4. The second bonding metal layer 5 is shown formed on the first major surface 15 of this baseplate 2, preferably by successively fabricating titanium and nickel sublayers and finally, by sputtering, a gold sublayer.

Figure 6:
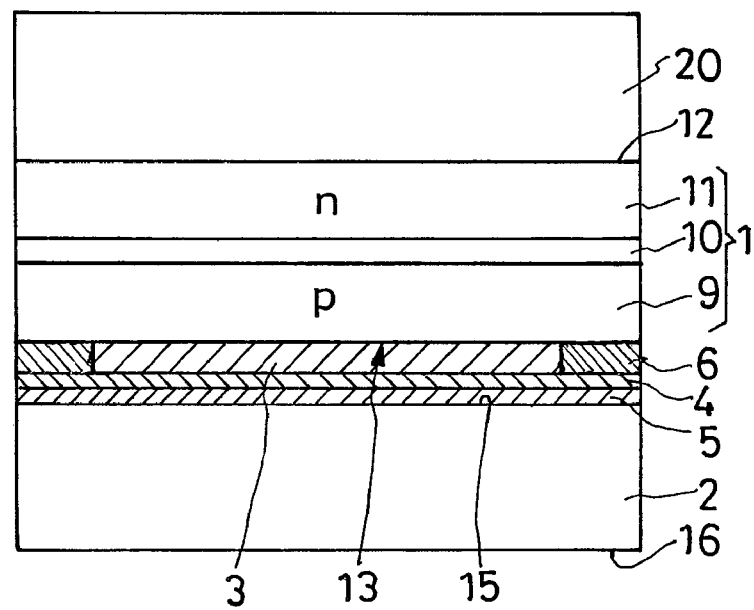
FIG. 6 is a view similar to FIG. 2 but showing the articles of FIGS. 4 and 5 bonded together via the two bonding metal layers under heat and pressure.

Then, as pictured in FIG. 6, the articles of FIGS. 4 and 5 are joined to each other by uniting the two bonding metal layers 4 and 5 under heat and pressure. Then the substrate 20 is removed from the first major surface 12 of the light-generating semiconductor region 1 thereby exposing its first major surface 12. The LED is completed as the first electrode 7 is conventionally formed on the thus-exposed first major surface 12 of the light-generating semiconductor region 1 and the second electrode 8 on the second major surface 16 of the baseplate 2. The substrate 20 could be removed from the light-generating semiconductor region 1 before the articles of FIGS. 4 and 5 are bonded to each other.

In the operation of the LED constructed and manufactured as described hereinabove, light will be generated in the active layer 10 of the light-generating semiconductor region 1 upon application of a forward voltage between the electrodes 7 and 8. Radiated toward the light-emitting first major surface 12 of the light-generating semiconductor region 1, part of the light will issue from that part of the surface 12 which is left exposed by the first electrode 7. The rest of the light will fall on the reflector layer 3 and be thereby redirected back toward the light-emitting surface 12, emerging therefrom together with the light that has been directly radiated toward the same.

The advantages gained by the above described embodiment of the invention may be recapitulated as follows:

1. Encircling the reflector layer 3, the anti-migration seal 6 effectively prevents the migration of the reflector metal (e.g., silver), enhancing the reliability of the LED and materially extending its useful life. Reflector metal migration has been easy to occur when the reflector layer is heated both during the process of bonding the baseplate 2 to the light-generating semiconductor region via the reflector layer and in use of the completed LED. Metal migration onto the exposed side surfaces of the light-generating semiconductor region 1 has posed a serious inconvenience of short-circuiting the pair of opposite conductivity type claddings 9 and 11 of that region. It is believed that the present invention has defeated this inconvenience.

2. The anti-migration seal 6 is made from the same material (e.g. gold) as the first bonding metal layer 4, so that the anti-migration seal is capable of fabrication practically at the same time with the first bonding metal layer, without substantially adding to the manufacturing steps of the LED.

3. Itself capable of reflecting the light from the light-generating semiconductor region 1, the anti-migration seal 6 does not significantly reduce the efficiency of the LED in the face of the size reduction of the reflector layer 3.

Figure 7:
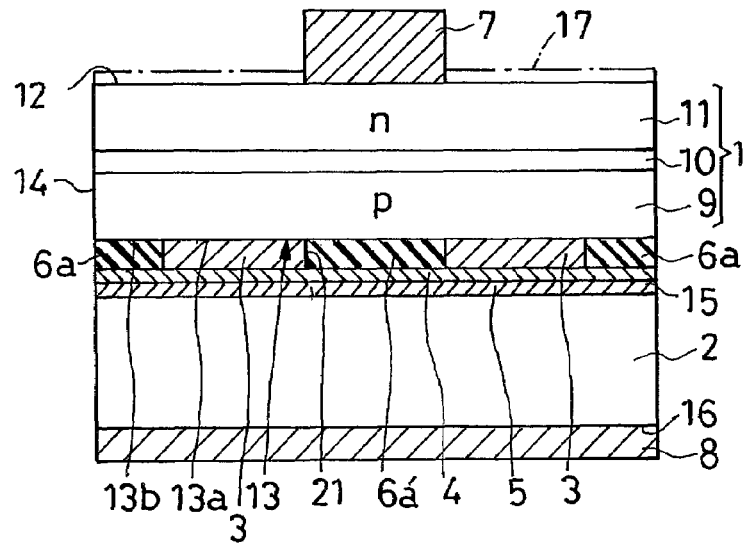
FIG. 7 is a sectional illustration of another preferred form of migration-proof LED according to the invention.

Embodiment of FIG. 7

This embodiment features an anti-migration seal $6_a$ of electrically insulating material, instead of conducting material as in the preceding embodiment, and a current baffle $6_a'$ of the same insulating material as the anti-migration seal. All the other details of construction are as set forth above in conjunction with the FIG. 1 embodiment.

Positioned just like its FIG. 1 counterpart 6, the anti-migration seal $6_a$ is made from silicon oxide ($SiO_2$), silicon nitride ($SiN_4$ or $Si_3N_4$), titanium oxide ($TiO_2$), alumina ($Al_2O_3$), or like electrically insulating substances.

The current baffle $6_a'$ is received in an opening 21 defined centrally through the reflector layer 3 in register with the first electrode 7. No exact alignment of the current baffle $6_a'$ with the first electrode 7, or no exact agreement in size, is required. Made from the same material as the anti-migration seal $6_a$, the current baffle $6_a'$ restricts current flow through that part of the active layer 10 of the light-generating semiconductor region 1 which underlies the first electrode 7. Thus does the current baffle $6_a'$ contribute to a higher efficiency of conversion from electric to optical energy.

The anti-migration seal $6_a$ is similar to its FIG. 1 counterpart 6 in preventing the migration of the reflector metal. Being made from the same material, moreover, both anti-migration seal $6_a$ and current baffle $6_a'$ are capable of concurrent fabrication. As an obvious alternative to this embodiment, the anti-migration seal $6_a$ and current baffle $6_a'$ may be made not from an insulating material or materials but from conducting or semiconducting substances that are higher than the reflector layer 3 in the resistance of contact with the light-generating semiconductor region 1.

Figure 8:
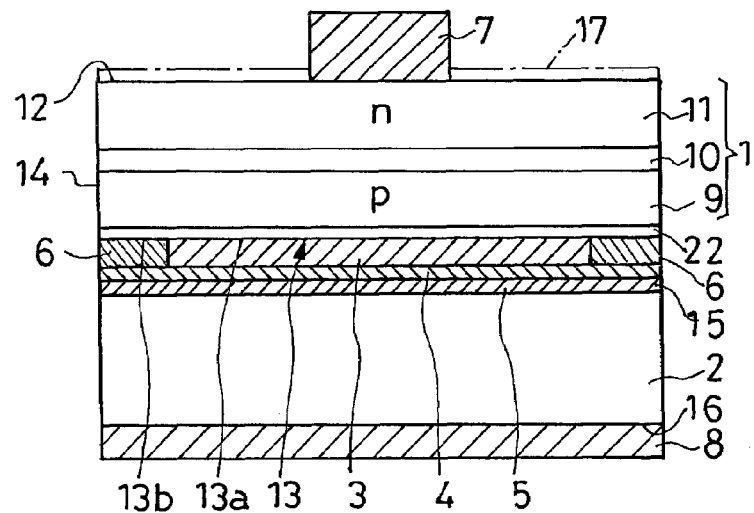
FIG. 8 is a sectional illustration of still another preferred form of migration-proof LED according to the invention.

Embodiment of FIG. 8

The LED according to the invention is here shown modified to include an anti-alloying layer 22 of electrically conducting, optically transparent material between light-generating semiconductor region 1 and reflector layer 3. All the other details of construction are as described above with respect to the FIG. 1 embodiment.

Made typically from indium tin oxide (ITO), the anti-alloying layer 22 makes low resistance contact with both light-generating semiconductor region 1 and reflector layer 3. As the name implies, the anti-alloying layer 22 is intended to prevent the reflector layer 3 from thermally uniting with the light-generating semiconductor region 1 with a consequent drop in reflectivity. This LED is therefore bound to retain its high efficiency for a longer period of time than the first described embodiment. Materials other than ITO are adoptable for the anti-alloying layer 22, examples being indium oxide ($In_2O_3$), tin dioxide ($SnO_2$), and zinc oxide (ZnO).

Figure 9:
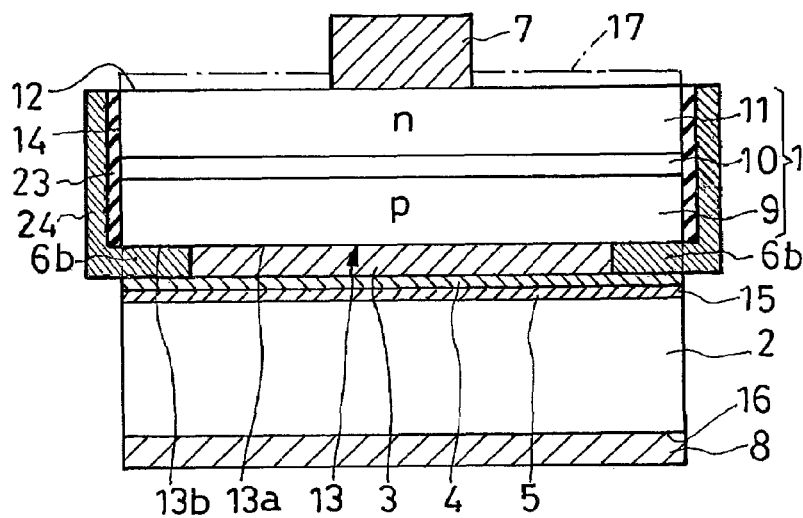
FIG. 9 is a sectional illustration of a further preferred form of migration-proof LED according to the invention.

Embodiment of FIG. 9

This embodiment features a protective covering 23 and a lateral reflector 24 and is otherwise identical in construction with that of FIG. 1. Made from an electrically insulating, optically transparent material, the protective covering 23 envelopes the complete side surfaces 14 of the light-generating semiconductor region 1 for guarding the same against reflector metal migration as well as from the atmosphere.

The lateral reflector 24 on the other hand is tubular in shape and wholly envelopes the protective covering 23 for internally reflecting, via the protective covering, the rays radiated more or less laterally from the active layer 10 in order to return them more or less directly toward the light-emitting major surface 12 of the light-generating semiconductor region 1. Preferably, for ease of fabrication and efficiency of manufacture, the lateral reflector 24 may be made from the same reflective material (e.g., gold) as is the anti-migration seal $6_b$ filling the annular space around the reflector layer 3. The lateral reflector 24 can then be formed practically concurrently with the anti-migration seal $6_b$ in one piece therewith.

Alternatively, the lateral reflector 24 may be made from a material different from that of the anti-migration seal $6_b$. The enveloping of the side surfaces 14 of the light-generating semiconductor region 1 by any such lateral reflector will be unnecessary, and the protective covering 23 need not be transparent, in cases where the side surfaces 14 of the light-generating semiconductor region 1 are not required to be internally reflective.

The LED of FIG. 9 possesses the following benefits relating to the protective covering 23 and lateral reflector 14 in addition to all those enumerated in connection with the first disclosed embodiment:

1. Dually guarded by the protective covering 23 and anti-migration seal $6_b$, the light-generating semiconductor region 1 of this embodiment is still more immune to short-circuiting by metal migration from the reflector layer 3 than that of the foregoing embodiments.

2. The LED is capable of still more efficiently converting the electric input into an optical output as the tubular lateral reflector 24 internally reflects, via the transparent protective covering 23, the lateral light radiations from the active layer 10.

3. The anti-migration seal $6_b$ and lateral reflector 24 are capable of joint fabrication, both being made from the same material.

Figure 10:
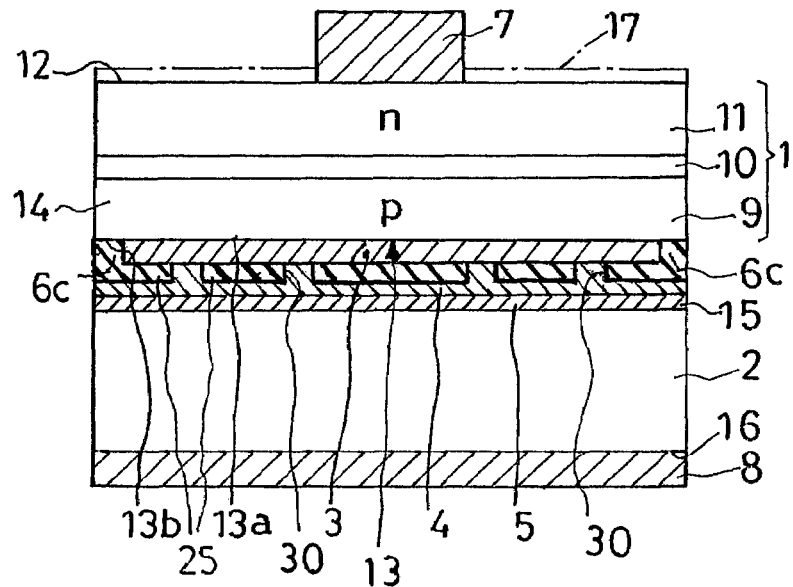
FIG. 10 is a sectional illustration of a further preferred form of migration-proof LED according to the invention.

Embodiment of FIG. 10

An insulator such as $SiO_2$, or any other material that is higher in resistivity than the first bonding metal layer 4, is employed for an anti-migration seal $6_c$ in this embodiment as in that of FIG. 7. Formed around the reflector layer 3 as in all the preceding embodiments, the anti-migration seal $6_c$ is here in one piece with an open-worked anti-migration layer 25 interposed between reflector layer 3 and first bonding metal layer 4. This first bonding metal layer is formed to include parts extending through a plurality or multiplicity of openings 30 in the anti-migration layer 25 thereby to be electrically coupled to the reflector layer 3. All the other details of construction are as stated above in connection with the FIG. 1 embodiment.

Metal migration from the reflector layer 3 is even more positively inhibited in this embodiment, not only by the anti-migration seal $6_c$ around the reflector layer but additionally by the anti-migration layer 25 underlying the reflector layer. Being made from the same material, the anti-migration seal $6_c$ and anti-migration layer 25 are capable of substantially simultaneous fabrication.

Figure 11:
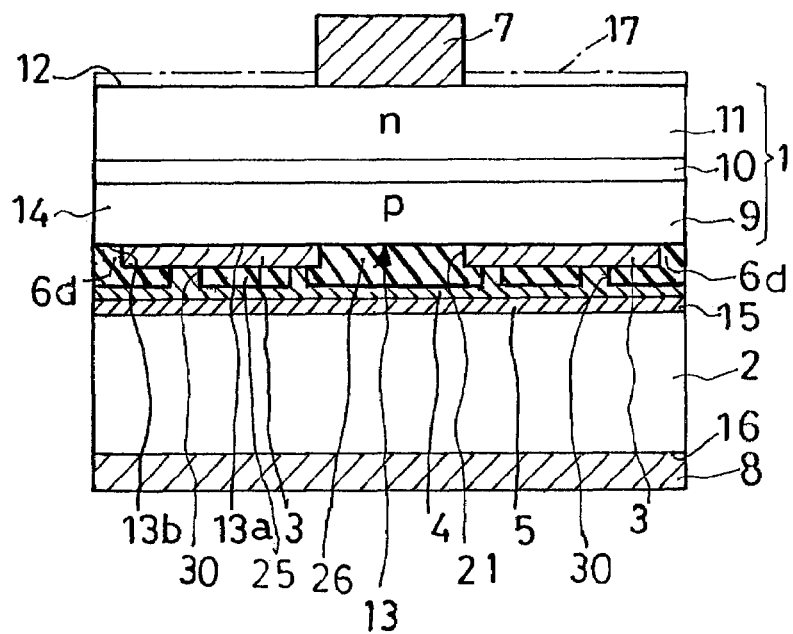
FIG. 11 is a sectional illustration of a still further preferred form of migration-proof LED according to the invention.

Embodiment of FIG. 11

An anti-migration seal $6_d$ employed here is similar to its FIG. 10 counterpart $6_c$ in being made from a material that is higher in resistivity than the first bonding metal layer 4 and in having the open-worked anti-migration layer 25 formed in one piece therewith. This embodiment differs from that of FIG. 10 in having a current baffle 26 formed in one piece with the anti-migration seal $6_d$ via the anti-migration layer 25. All the other details of construction are as stated above in connection with the FIG. 1 embodiment.

Like its FIG. 7 counterpart $6_a'$, the current baffle 26 is received in the opening 21 defined centrally through the reflector layer 3 in register with the first electrode 7. Made from an electrically insulating or resistive material, the current baffle 26 restricts current flow through that part of the active layer 10 of the light-generating semiconductor region 1 which underlies the first electrode 7. Thus does the current baffle 26 contribute to a higher efficiency of conversion from electric to optical energy. Additional benefits of this embodiment are considered self-evident from the description of the foregoing embodiments.

Possible Modifications

Notwithstanding the foregoing detailed disclosure it is not desired that the present invention be limited by the exact showings of the drawings or the description thereof. The following is a brief list of possible modifications, alterations or adaptations of the illustrated exemplary embodiments which are all believed to fall within the purview of the claims annexed hereto:

1. A semiconductor layer for improvement of contact ohmicity could be interposed between light-generating semiconductor region 1 and reflector layer 3 in all the embodiments disclosed herein.

2. The light-generating semiconductor region 1 could be made not only from nitride semiconductors but from AlGaInP and other Groups III-V compound semiconductors.

3. The claddings 9 and 11 of the light-generating semiconductor region 1 are reversible in conductivity type.

4. The baseplate 2 could be made from a semiconductor, possibly together with a semiconductor device such as a diode.

5. The light-generating semiconductor region 1 together with reflector layer 3 could be united with the baseplate 2 via a single bonding metal layer, instead of two as in all the embodiments disclosed.

6. The anti-migration seal according to the invention may be filled in the annular space around the reflector layer 3 by methods other than that disclosed herein. For example, an LED having such an annular space may first be received in a cup-like envelope with a clearance, and this clearance as well as the annular space may be filled with a material capable of preventing reflector metal migration.

7. The current baffle 6$_a$' of FIG. 7 might be added to the LEDs of FIGS. 8 and 9.

8. The anti-alloying layer 22 of FIG. 8 might be added to the LEDs of FIGS. 7, 9, 10 and 11.

What is claimed is:

1. A light-emitting semiconductor device protected against reflector metal migration, comprising:
   (a) a light-generating semiconductor region having a plurality of semiconductor layers for generating light, the light-generating semiconductor region having a pair of opposite major surfaces;
   (b) a baseplate held against one of the pair of opposite major surfaces of the light-generating semiconductor region;
   (c) an electrode on the other major surface of the light-generating semiconductor region;
   (d) a metal-made reflector layer for redirecting toward said other major surface of the light-generating semiconductor region the light from the light-generating semiconductor region, the reflector layer being interposed between the light-generating semiconductor region and the baseplate so as to leave a substantially annular marginal space therebetween; and
   (e) an anti-migration seal received at least in part in the substantially annular marginal space between the light-generating semiconductor region and the baseplate for sealing the reflector layer against metal migration therefrom, the anti-migration seal being made from a metal that is less easy of migration than the metal from which is made the reflector layer.

2. A migration-proof light-emitting semiconductor device as defined in claim 1, wherein the reflector layer and anti-migration seal on the light-generating semiconductor region are joined to the baseplate via a bonding metal layer, and wherein the anti-migration seal is of the same material as the bonding metal layer.

3. A migration-proof light-emitting semiconductor device as defined in claim 1, further comprising a current baffle on said one major surface of the light-generating semiconductor region approximately in register with the electrode on said other major surface of the light-generating semiconductor region, the current baffle being made from a material that is higher in resistivity than that of the reflector layer.

4. A migration-proof light-emitting semiconductor device as defined in claim 3, wherein the current baffle is received in an opening defined in the reflector layer in register with the electrode.

5. A migration-proof light-emitting semiconductor device as defined in claim 3, wherein the current baffle is of the same material as the anti-migration seal.

6. A migration-proof light-emitting semiconductor device as defined in claim 1, further comprising an anti-alloying layer of electrically conducting, optically transparent material between the light-generating semiconductor region and the reflector layer.

7. A migration-proof light-emitting semiconductor device as defined in claim 1, wherein the light-generating semiconductor region has side surfaces between the pair of opposite major surfaces, and wherein the device further comprises a protective covering of electrically insulating material enveloping the side surfaces of the light-generating semiconductor region.

8. A migration-proof light-emitting semiconductor device as defined in claim 7, wherein the protective covering is of optically transparent material, and wherein the device further comprises a lateral reflector enveloping the side surfaces of the light-generating semiconductor region via the protective covering for internally reflecting the light from the light-generating semiconductor region.

9. A migration-proof light-emitting semiconductor device as defined in claim 8, wherein the lateral reflector is of the same material as the anti-migration seal.

10. A migration-proof light-emitting semiconductor device as defined in claim 1, wherein the reflector layer and anti-migration seal on the light-generating semiconductor region are joined to the baseplate via a bonding metal layer, wherein the anti-migration seal is made from a material that is higher in resistivity than that of the bonding metal layer, and wherein the device further comprises an open-worked anti-migration layer formed in one piece with the anti-migration seal and interposed between the reflector layer and the bonding metal layer, the bonding metal layer having parts extending through openings in the open-worked anti-migration layer and joined to the reflector layer.

11. A migration-proof light-emitting semiconductor device as defined in claim 10, further comprising a current baffle formed in one piece with the open-worked anti-migration layer and received in an opening defined in the reflector layer in register with the electrode.

* * * * *